(12) United States Patent
Lee et al.

(10) Patent No.: US 12,534,394 B2
(45) Date of Patent: Jan. 27, 2026

(54) WINDOW AND DISPLAY DEVICE INCLUDING THE SAME

(71) Applicants: Samsung Display Co., Ltd., Yongin-si (KR); KONGJU NATIONAL UNIVERSITY INDUSTRY—UNIVERSITY COOPERATION FOUNDATION, Gongju-si (KR)

(72) Inventors: Jaegil Lee, Yongin-si (KR); Woonjin Chung, Yongin-si (KR); Seung Kim, Yongin-si (KR); Seungho Kim, Yongin-si (KR); Cheolmin Park, Yongin-si (KR); Gyuin Shim, Yongin-si (KR); Jin-Won Jang, Yongin-si (KR); Somi Jung, Yongin-si (KR); Hui Yeon Shon, Yongin-si (KR); Mingyeong Kang, Yongin-si (KR); Kyeongdae Park, Gongju-si (KR); Seongyoung Park, Gongju-si (KR)

(73) Assignees: Samsung Display Co., Ltd., Yongin-si (KR); Kongju National University Industry—University Cooperation Foundation, Gongju-si (KR)

( * ) Notice: Subject to any disclaimer, the term of this patent is extended or adjusted under 35 U.S.C. 154(b) by 127 days.

(21) Appl. No.: 18/236,874

(22) Filed: Aug. 22, 2023

(65) Prior Publication Data

US 2024/0132392 A1   Apr. 25, 2024
US 2024/0228361 A9   Jul. 11, 2024

(30) Foreign Application Priority Data

Oct. 25, 2022  (KR) .................. 10-2022-0138685

(51) Int. Cl.
C03C 3/078 (2006.01)
B32B 7/12 (2006.01)
(Continued)

(52) U.S. Cl.
CPC ................ *C03C 3/078* (2013.01); *B32B 7/12* (2013.01); *B32B 17/06* (2013.01); *H05K 5/03* (2013.01);
(Continued)

(58) Field of Classification Search
CPC ............................................ C03C 3/00–3/328
See application file for complete search history.

(56) References Cited

U.S. PATENT DOCUMENTS 8,796,165 B2   8/2014  Ellison et al.
9,898,046 B2   2/2018  Chang et al.
(Continued)

FOREIGN PATENT DOCUMENTS

CN     111533447 A     8/2020
DE   10-2014-108057 A1  12/2015
(Continued)

*Primary Examiner* — Prashant J Khatri
(74) *Attorney, Agent, or Firm* — Womble Bond Dickinson (US) LLP

(57) ABSTRACT

A display device includes: a display panel; and a window on the display panel, wherein the window includes a glass substrate having a thickness of 20 micrometers (μm) to 100 μm, and the glass substrate contains, on a basis of an entirety of the glass substrate, more than 75 mol % and less than 85 mol % of $SiO_2$, more than 10 mol % and less than 20 mol % of $Na_2O$, and more than 0 mol % and less than 10 mol % of CaO, respectively.

20 Claims, 8 Drawing Sheets

(51) Int. Cl.
  *B32B 17/06* (2006.01)
  *H05K 5/03* (2006.01)

(52) U.S. Cl.
  CPC ..... *B32B 2307/536* (2013.01); *B32B 2307/54* (2013.01); *B32B 2307/552* (2013.01); *B32B 2307/558* (2013.01); *B32B 2307/72* (2013.01); *B32B 2307/7376* (2023.05); *B32B 2457/20* (2013.01)

(56) References Cited

U.S. PATENT DOCUMENTS

| | | | |
|---|---|---|---|
| 10,071,933 | B2 | 9/2018 | Wang et al. |
| 10,261,545 | B2 | 4/2019 | Kim et al. |
| 10,665,816 | B2 | 5/2020 | Oh et al. |
| 10,732,445 | B2 | 8/2020 | Shin et al. |
| 10,817,016 | B2 | 10/2020 | Kim et al. |
| 10,949,051 | B2 | 3/2021 | Sirpal et al. |
| 11,261,125 | B2 | 3/2022 | Beall et al. |
| 11,279,649 | B2 | 3/2022 | Gross et al. |
| 11,453,612 | B2 | 9/2022 | Roussev et al. |
| 2011/0091704 | A1* | 4/2011 | Akiba ............ C03C 3/085 501/72 |
| 2013/0115422 | A1 | 5/2013 | Murata |
| 2013/0224491 | A1* | 8/2013 | Smedskjaer ......... C03C 3/091 501/67 |
| 2013/0330515 | A1 | 12/2013 | Oh et al. |
| 2014/0272345 | A1 | 9/2014 | Levine et al. |
| 2015/0353418 | A1 | 12/2015 | Damm et al. |
| 2016/0002103 | A1 | 1/2016 | Wang et al. |
| 2016/0369387 | A1 | 12/2016 | Ciraldo et al. |
| 2017/0341973 | A1 | 11/2017 | Gross et al. |
| 2018/0297892 | A1 | 10/2018 | Lee et al. |
| 2019/0132392 | A1* | 5/2019 | Liu ................ H04L 67/02 |
| 2020/0165162 | A1 | 5/2020 | Bellman et al. |
| 2022/0144690 | A1 | 5/2022 | Beall et al. |
| 2022/0274865 | A1 | 9/2022 | Gross et al. |

FOREIGN PATENT DOCUMENTS

| | | |
|---|---|---|
| JP | 2016-508954 A | 3/2016 |
| KR | 10-1441600 B1 | 9/2014 |
| KR | 10-2015-0129732 A | 11/2015 |
| KR | 10-2015-0140570 A | 12/2015 |
| KR | 10-1620375 B1 | 5/2016 |
| KR | 10-1661278 B1 | 9/2016 |
| KR | 10-1684344 B1 | 12/2016 |
| KR | 10-2017-0130498 A | 11/2017 |
| KR | 10-1825276 B1 | 2/2018 |
| KR | 10-1902597 B1 | 9/2018 |
| KR | 10-2018-0136490 A | 12/2018 |
| KR | 10-2019-0012143 A | 2/2019 |
| KR | 10-1972444 B1 | 4/2019 |
| KR | 10-2000340 B1 | 7/2019 |
| KR | 10-2019-0099233 A | 8/2019 |
| KR | 10-2022450 B1 | 9/2019 |
| KR | 10-2019-0113532 A | 10/2019 |
| KR | 10-2041441 B1 | 11/2019 |

\* cited by examiner

WINDOW AND DISPLAY DEVICE INCLUDING THE SAME

CROSS-REFERENCE TO RELATED APPLICATION

The present application claims priority to and the benefit of Korean Patent Application No. 10-2022-0138685, filed on Oct. 25, 2022, in the Korean Intellectual Property Office, the entire content of which is hereby incorporated by reference.

BACKGROUND

1. Field

Aspects of some embodiments of the present disclosure herein relate to a window and a display device including the same.

2. Description of the Related Art

To display image or graphical information to users, display devices are used in various multimedia apparatuses, such as televisions, mobile phones, tablet computers, and game consoles, among various other multimedia apparatuses. In recent days, various types of flexible display devices capable of folding or bending have been developed.

A flexible display device may include a foldable or bendable display module and a window. The window included in the display device effectively transmits image information provided from the display module to the outside and protects the display module from the outside.

A glass substrate used for a window of a flexible display device may be an ultra-thin glass substrate. The ultra-thin glass substrate requires not only foldability or bendability but also excellent impact resistance against impact caused by a user's input or external impact. Accordingly, developments of a composition of an ultra-thin glass substrate having excellent impact resistance are in progress.

The above information disclosed in this Background section is only for enhancement of understanding of the background and therefore the information discussed in this Background section does not necessarily constitute prior art.

SUMMARY

Aspects of some embodiments of the present disclosure herein relate to a window and a display device including the same, and for example, to a window including a glass substrate with excellent impact resistance and a flexible display device including the same.

Aspects of some embodiments of the present disclosure further include a window including an ultra-thin glass substrate having excellent impact resistance.

Aspects of some embodiments of the present disclosure further include a display device including a window that includes a glass substrate having excellent impact resistance.

According to some embodiments of the inventive concept, a window includes a glass substrate having a thickness of about 20 μm to about 100 μm, and the glass substrate contains, on a basis of the entire glass substrate, more than about 75 mol % and less than about 85 mol % of SiO2, more than about 10 mol % and less than about 20 mol % of Na2O, and more than about 0 mol % and less than about 10 mol % of CaO.

According to some embodiments, the glass substrate may have a hardness of greater than about 4.5 GPa and less than about 5.0 GPa.

According to some embodiments, the glass substrate may have a brittleness of greater than about 4.8 $\mu m^{-0.5}$ and less than about 5.8 $\mu m^{-0.5}$.

According to some embodiments, the glass substrate may have a Young's modulus of greater than about 60 GPa and less than about 70 GPa.

According to some embodiments, the glass substrate may have a coefficient of thermal expansion of greater than about $85\times10^{-7}$/K and less than about $95\times10^{-7}$/K.

According to some embodiments, the glass substrate may have a fracture toughness of greater than about 0.7 $MPa \cdot m^{0.5}$ and less than about 1.2 $MPa \cdot m^{0.5}$.

According to some embodiments, the glass substrate may have a glass transition temperature of greater than about 500° C. and less than about 600° C.

According to some embodiments, the glass substrate may have a Poisson's ratio of greater than about 0.18 and less than about 0.22.

According to some embodiments, the glass substrate may have a density of greater than about 2.3 $g/cm^3$ and less than about 2.6 $g/cm^3$.

According to some embodiments of the inventive concept, a window includes a glass substrate having a thickness of about 20 μm to about 100 μm, and the glass substrate contains $SiO_2$, an alkali oxide, and an alkaline earth metal oxide, and satisfies Equation (1):

$$R \text{ ratio} = 0 \qquad \text{Equation (1)}$$

wherein in Equation (1), R ratio is a ratio of moles of $Al_2O_3$ to moles of the alkali oxide.

According to some embodiments, the glass substrate may contain, on a basis of the entire glass substrate, more than about 13 mol % and less than about 18 mol % of the alkali oxide.

According to some embodiments, the glass substrate may contain, on a basis of the entire glass substrate, more than about 0 mol % and less than about 10 mol % of the alkaline earth metal oxide.

According to some embodiments, the alkali oxide may be $Na_2O$.

According to some embodiments, the glass substrate may contain, on a basis of the entire glass substrate, more than about 10 mol % and less than about 20 mol % of the $Na_2O$.

According to some embodiments, the alkaline earth metal oxide may be CaO.

According to some embodiments, the glass substrate may contain, on a basis of the entire glass substrate, more than about 0 mol % and less than about 10 mol % of the CaO.

According to some embodiments, the glass substrate may have a hardness of greater than about 4.5 GPa and less than about 5.0 GPa, and a brittleness of greater than about 4.8 $\mu m^{-0.5}$ and less than about 5.8 $\mu m^{-0.5}$.

According to some embodiments of the inventive concept, a display device includes a display panel and a window on the display panel, the window includes a glass substrate having a thickness of about 20 μm to about 100 μm, and the glass substrate contains, on a basis of the entire glass substrate, more than about 75 mol % and less than about 85 mol % of $SiO_2$, more than about 10 mol % and less than about 20 mol % of $Na_2O$, and more than about 0 mol % and less than about 10 mol % of CaO.

According to some embodiments, the glass substrate may have a hardness of greater than about 4.5 GPa and less than about 5.0 GPa, and have a brittleness of greater than about 4.8 $\mu m^{-0.5}$ and less than about 5.8 $\mu m^{-0.5}$.

According to some embodiments, the display device may further include an adhesive layer between the display panel and the window

BRIEF DESCRIPTION OF THE DRAWINGS

The accompanying drawings are included to provide a further understanding of the inventive concept, and are incorporated in and constitute a part of this specification. The drawings illustrate aspects of some embodiments of the inventive concept and, together with the description, serve to explain principles of the inventive concept. In the drawings.

DETAILED DESCRIPTION

Figure 1A:
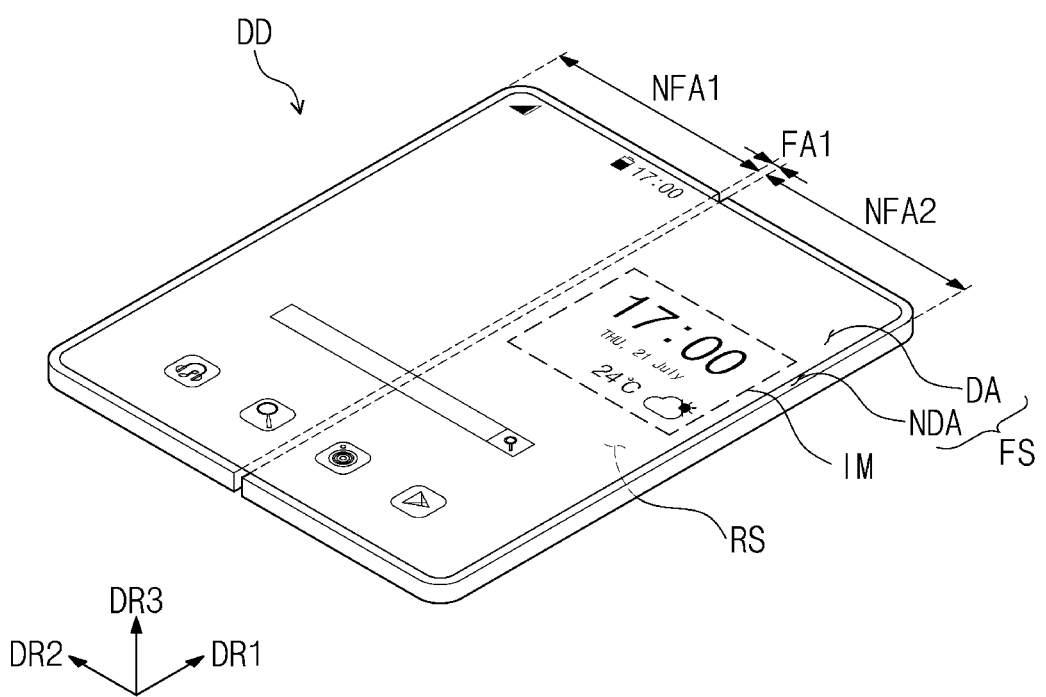
FIG. 1A is a combined perspective view illustrating an unfolded state of a display device according to some embodiments of the inventive concept.

According to some embodiments of the present disclosure, various modifications may be made and various forms may be applied, and specific embodiments will be illustrated in the drawings and described in more detail in the text. However, this is not intended to limit embodiments according to the present disclosure to a specific disclosure form, it should be understood to include all changes, equivalents, and substitutes included in the spirit and scope of embodiments according to the present disclosure.

It will be understood that when an element (region, layer, part, etc.) layer is referred to as being "on", "connected to" or "coupled to" another element, it can be directly on/connected/coupled to the other element or intervening elements may be present.

In contrast, herein, when an element is referred to as being "directly located on," other layers, membranes, regions, or plates, there are no intervening layers, membranes, regions, or plates present. For example, "directly located on" may mean that two layers or two members are directly arranged or located on each other (e.g., in contact with each other) without using an additional intervening member, layer, or component, such as an adhesive member.

Like reference numerals or symbols refer to like elements throughout. Also, in drawings, the thickness and the ratio and the dimension of the element are exaggerated for effective description of the technical contents.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from other elements. For example, a first element discussed below could be termed a second element, and similarly, a second element discussed below could be termed a first element without departing from the teachings of embodiments of the inventive concept. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings. In the present specification, "located on" may refer to a case of being located not only on the upper part of any one member but also on the lower part.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a window and a display device according to some embodiments of the inventive concept will be explained in more detail with reference to the accompanying drawings.

Figure 1B:
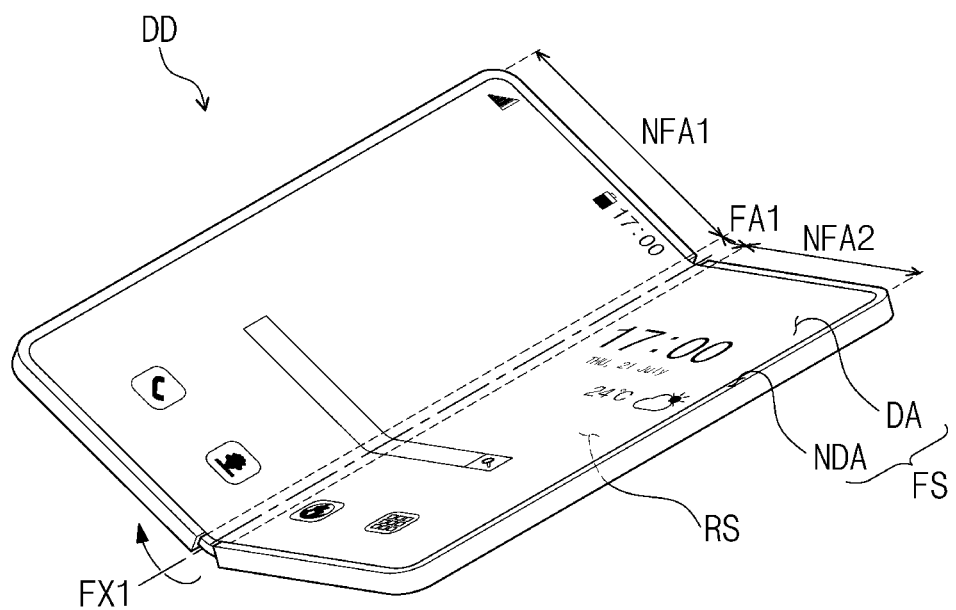
FIG. 1B is a combined perspective view illustrating an in-folded state of a display device according to some embodiments of the inventive concept.
Figure 1C:
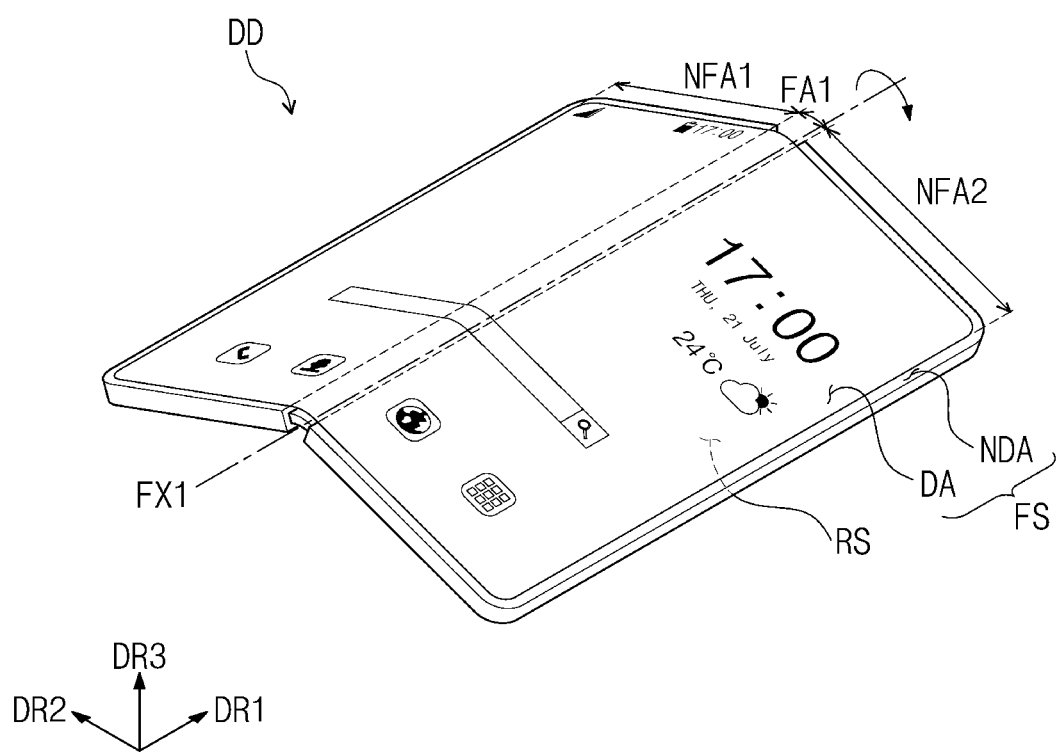
FIG. 1C is a combined perspective view illustrating an out-folded state of a display device according to some embodiments of the inventive concept.

FIG. 1A is a combined perspective view illustrating an unfolded state of a display device DD according to some embodiments of the inventive concept. FIG. 1B is a combined perspective view illustrating an in-folded state of the display device DD according to some embodiments of the inventive concept. FIG. 1C is a combined perspective view illustrating an out-folded state of the display device DD according to some embodiments of the inventive concept.

The display device DD according to some embodiments may be activated in response to an electrical signal. For example, the display device DD may be a mobile phone, a tablet computer, a car navigation system, a game console, or a wearable device, but embodiments of the inventive concept are not limited thereto, and the display device DD may be any suitable electronic or multimedia device configured to display graphical images. In the present specification, FIGS. 1A, etc., illustrates an example in which the display device DD is a mobile phone.

Meanwhile, FIG. 1A and the following drawings illustrate a first direction DR1, a second direction DR2, and a third direction DR3, and directions indicated by the first through the third direction DR1, DR2, and DR3 described herein may be relative concepts and be thus changed into other directions.

Referring to FIGS. 1A through 1C, the display device DD according to some embodiments may include a first display surface FS that is parallel to a plane defined by the first direction DR1 and the second direction DR2 crossing the first direction DR1. The display device DD may provide or display images IM to a user through the first display surface FS. The display device DD according to some embodiments may display the images IM, in the third direction DR3, on the first surface FS parallel to each of the first direction DR1 and the second direction DR2. In this specification, a front surface (or an upper surface) and a rear surface (or a lower surface) of each component are defined with respect to the direction in which the image IM is displayed. The front surface and the rear surface may be opposed to each other in the third direction DR3, and a normal direction of each of the front surface and the rear surface may be parallel to the third direction DR3.

The display device DD according to some embodiments may include a first display surface FS and a second display surface RS. The first display surface FS may include a display region DA and a non-display region NDA. The display region DA may include an electronic module region. The second display surface RS may be located at a surface of the display device DD that is on an opposite side of the display device DD relative to the first display surface FS. That is, the second display surface RS may be defined as a portion of the rear surface of the display device DD.

The display device DD according to some embodiments may detect an external input applied from the outside. The external input may include various types of inputs provided from the outside of the display device DD. For example, the external input may include an external input applied close to the display device DD, or an external input (for example, hovering) adjacent to the display device DD within a distance (e.g., a set or predetermined distance), as well as a touch by a part of a user's body such as a user's hand or finger, or a touch input from a stylus or pen. In addition, the external input may have various types such as force, pressure, temperature, light, or the like.

The display device DD may include a folding region FA1 and non-folding regions NFA1 and NFA2. The display device DD according to some embodiments may include a first non-folding region NFA1 and a second non-folding region NFA2 arranged with the folding region FA1 therebetween. Meanwhile, FIGS. 1A through 1C illustrate aspects of some embodiments of the display device DD including a single folding region FA1. However, embodiments of the inventive concept are not limited thereto, and a plurality of folding regions may be defined in the display device DD.

Referring to FIG. 1B, the display device DD according to some embodiments may be folded with respect to a first folding axis FX1. The first folding axis FX1 may be a virtual axis extending in the first direction DR1, and parallel to a long-side direction of the display device DD. The first folding axis FX1 may extend along the first direction DR1 on the first display surface FS.

According to some embodiments, the non-folding regions NFA1 and NFA2 may be located adjacent to the folding region FA1, with the folding region FA1 therebetween. For example, the first non-folding region NFA1 may located on one side of the folding region FA1 along the second direction DR2, and the second non-folding region NFA2 may be located on the other side of the folding region FA1 along the second direction DR2.

The display device DD may be folded with respect to the first folding axis FX1, and transformed into the in-folded state in which one region, of the first display surface FS, overlapping the first non-folding region NFA1 and the other region, of the first display surface FS, overlapping the second non-folding region NFA2 face each other. Meanwhile, when the display device DD according to some embodiments is in the in-folded state, the second display surface RS may be visible to a user. The second display surface RS may further include an electronic module region in which an electronic module including various components is located, but embodiments of the inventive concept are not limited thereto.

Referring to FIG. 1C, the display device DD according to some embodiments may be folded with respect to the first folding axis FX1, and transformed into the out-folded state in which one region, of the second display surface RS, overlapping the first non-folding region NFA1 and the other region, of the second display surface RS, overlapping the second non-folding region NFA2 face each other. However, embodiments of the inventive concept are not limited thereto, the display device DD may be folded with respect to a plurality of the folding axes, and the display device DD may be folded such that a part of the first display surface FS and a part of the second display surface RS may face each other. The number of the folding axes and the number of the non-folding regions corresponding thereto are not particularly limited.

The display device DD may further include various electronic modules. For example, the electronic modules may include at least one of a camera, a speaker, an optical sensor, or a thermal sensor. The electronic module may detect an external object received through the first or second display surface FS or RS, or provide a sound signal such as a voice or the like to the outside through the first or second display surface FS or RS. The electronic modules may each include a plurality of components, but embodiments of the inventive concept are not limited thereto.

Figure 2A:
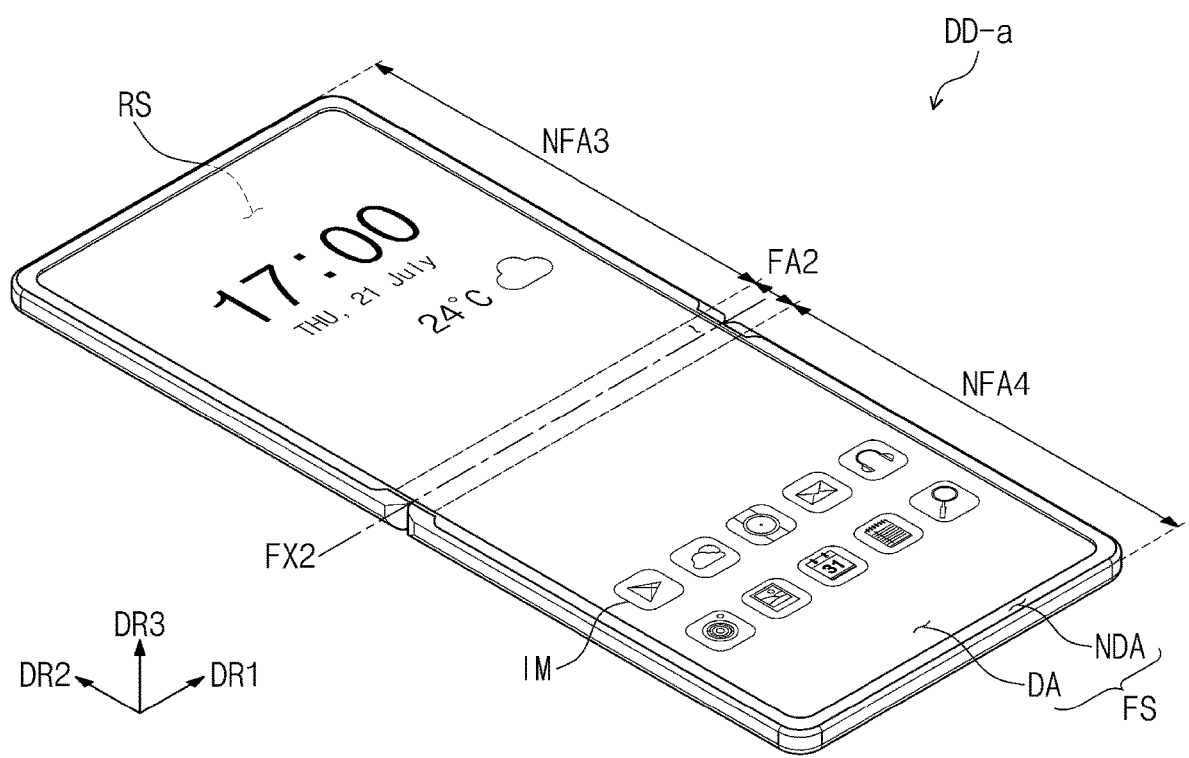
FIG. 2A is a combined perspective view illustrating an unfolded state of a display device according to some embodiments of the inventive concept.
Figure 2B:
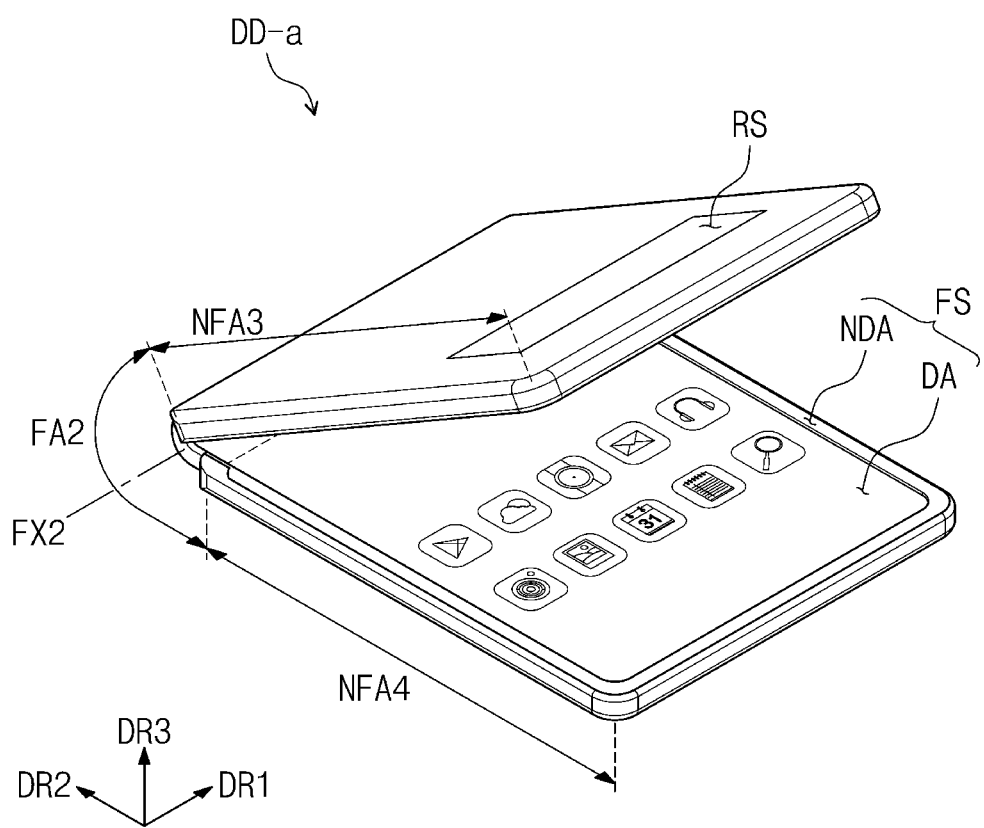
FIG. 2B is a combined perspective view illustrating an in-folded state of a display device according to some embodiments of the inventive concept.

FIG. 2A is a combined perspective view illustrating an unfolded state of a display device DD-a according to some embodiments of the inventive concept. FIG. 2B is a combined perspective view illustrating an in-folded state of the display device DD-a according to some embodiments of the inventive concept.

The display device DD-a according to some embodiments may be folded with respect to the second folding axis FX2 extending in one direction parallel to the first direction DR1. FIG. 2B illustrates that an extension direction of the second folding axis FX2 is parallel to an extension direction of a short side of the display device DD-a. However, embodiments of the inventive concept are not limited thereto.

The display device DD-a according to some embodiments may include at least one folding region FA2 or non-folding regions NF3 and NFA4 adjacent to the folding region FA2. The non-folding regions NF3 and NF4 may be arranged to be spaced apart from each other with the folding region FA2 therebetween.

According to some embodiments, the display device DD-a may be in-folded such that a third non-folding region NFA3 and a fourth non-folding region NF4 face each other, and a display surface FS is not exposed to the outside. In addition, unlike what is illustrated, the display device DD-a according to some embodiments may be out-folded such that the display surface FS is exposed to the outside. Also, the display device DD-a according to some embodiments may include a first display surface FS and a second display surface RS, and the first display surface FS may include a display region DA and a non-display region NDA. Also, the display device DD-a may further include various electronic modules.

The display devices DD and DD-a according to embodiments described with reference to FIGS. 1A through 1C, 2A and 2B may be configured such that an in-folding or an out-folding operation is repeated from an unfolding operation and vice versa, but embodiments of the inventive concept are not limited thereto. According to some embodiments of the inventive concept, the display devices DD and DD-a may be configured to select any one of the unfolding operation, the in-folding operation, or the out-folding operation. According to some embodiments, the display device according to some embodiments may be a flexible display device including a plurality of folding regions, or having at least one region capable of bending or rolling.

Figure 3:
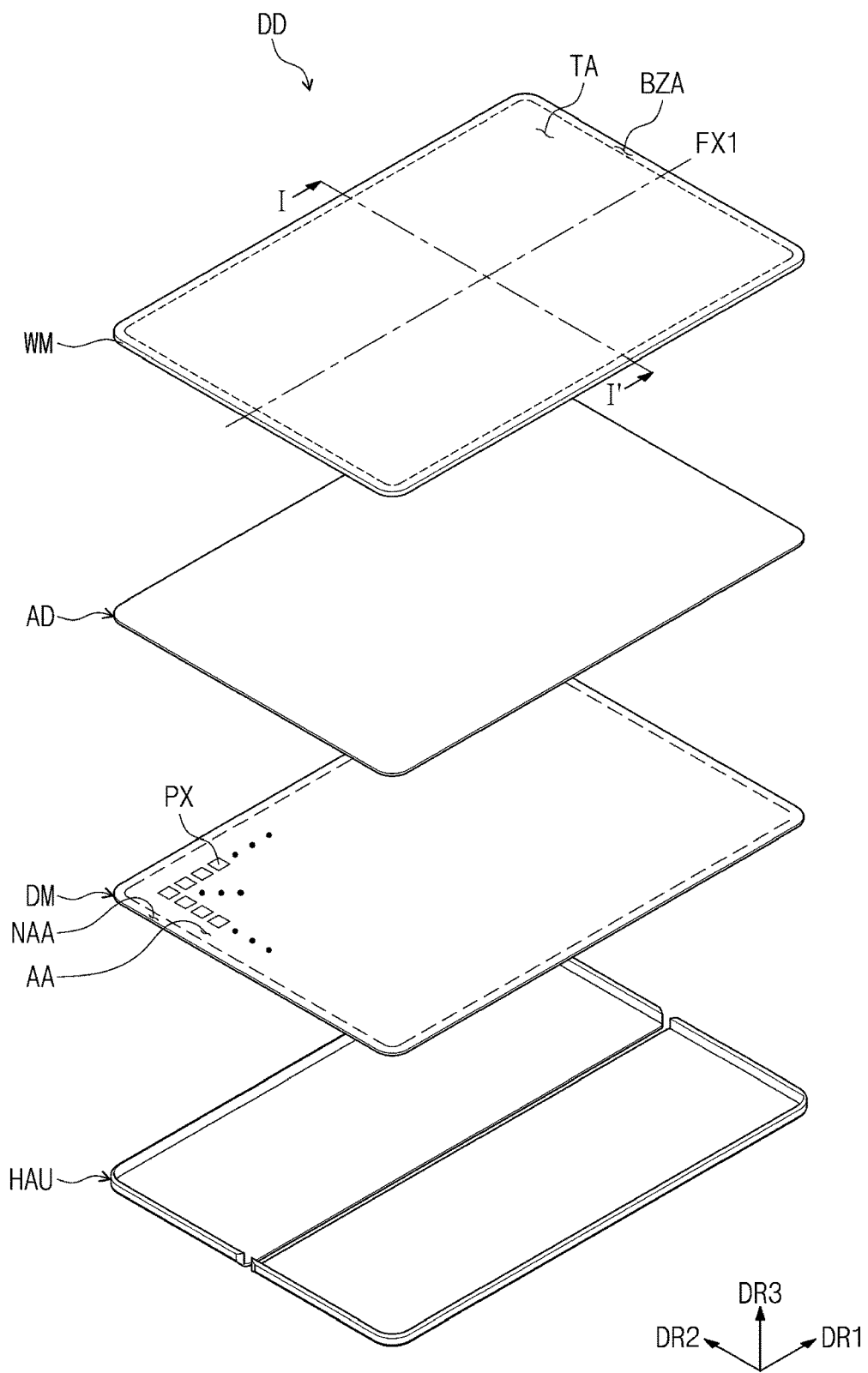
FIG. 3 is an exploded perspective view of a display device according to some embodiments of the inventive concept.

FIG. 3 is an exploded perspective view of a display device DD according to some embodiments of the inventive concept. FIG. 3 illustrates an example exploded perspective view of the display device DD according to the embodiments illustrated in FIG. 1A.

Referring to FIG. 3, the display device DD according to some embodiments may include a display module DM, an adhesive layer AD located on the display module, and a window WM located on the adhesive layer AD. The window WM may be located on top of and/or under the display module DM. FIG. 3 illustrates that the window WM is located on top of the display module DM.

Also, the display device DD according to some embodiments may further include an electronic module located below the display module DM. For example, the electronic module may include a camera module.

In the display device DD according to some embodiments, the adhesive layer AD located between the window WM and the display module DM may be an optically clear adhesive film (OCA) or an optically clear adhesive resin layer (OCR). Meanwhile, according to some embodiments, the adhesive layer AD may also be omitted.

According to some embodiments, the display device DD according to some embodiments may further include a polarizing film located between the display module DM and the adhesive layer AD. The polarizing film may be a film including an optical function for improving the light-extraction efficiency of the display module DM.

According to some embodiments, the display device DD according to some embodiments may further include a lower functional layer located below the display module DM. The lower functional layer may support the display module DM, or prevent the display device DD from being deformed due to external impact or force. The lower functional layer may include at least one of a cushion layer, a support plate, a shielding layer, a filling layer, or an interlayer bonging layer.

The display device DD may further include a housing HAU accommodating the display module DM, the lower functional layer, etc. The housing HAU may be coupled to the widow WM to form the exterior of the display device DD. The housing HAU may include a material having relatively high rigidity. For example, the housing HAU may include a plurality of frames and/or plates made of glass, plastic, or metal. The display module DM may be accommodated in an accommodating space and be protected from the external impact. According to some embodiments, the housing HAU may further include a hinge structure for easy folding or bending.

The display module DM according to some embodiments may display an image IM in response to an electrical signal and transmit/receive information about an external input. The display module DM may include, a display panel, and a sensor layer located on the display panel.

The display module DM may include an active region AA and a peripheral region NAA. The active region AA may be a region providing an image IM (FIG. 1A). A pixel PX may be located in the active region AA. The peripheral region NAA may be adjacent to the active region AA. The peripheral region NAA may surround the active region AA. A driving circuit, a driving line, etc., for driving the active region AA may be located in the peripheral region NAA.

The display module DM may include a plurality of pixels PX. Each of the pixels PX may display light in response to an electrical signal. The light displayed by the pixels PX may allow an image IM to be viewed. Each of the pixels PX may include a display element. For example, the display element may be an organic light-emitting element, an inorganic light-emitting element, an organic-inorganic light-emitting element, a micro light-emitting element (a micro-LED), a nano light-emitting element (a nano LED), a quantum dot light-emitting element, an electrophoretic element, an electrowetting element, etc.

The window WM may cover an entire upper surface of the display device DD. The window WM may have a shape corresponding to a shape of the display module DM. The window WM may have a flexibility and is thus deformed according to folding or bending of the display device DD. The window WM may function to protect the display module DM from external impact.

The window WM may include a transmissive region TA and a bezel region BZA. The transmissive region TA may overlap at least a portion of the active region AA of the display module DM. The transmissive region TA may be a region which is optically transparent. For example, the transmissive region TA may have a light transmittance of about 90% or greater in the visible light range. An image IM (FIG. 1A) may be provided to a user through the transmissive region TA, and the user may receive information through the image IM (FIG. 1A).

The bezel region BZA may be a region which has a respectively lower light transmittance than the transmissive region TA. The bezel region BZA may define a shape of the transmissive region TA. The bezel region may have a color (e.g., a set or predetermined color). The bezel region BZA may cover the peripheral region NAA of the display module DM to block the peripheral region NAA from being viewed from the outside. Meanwhile, this is an example, and thus, in the window WM according to some embodiments, the bezel region BZA may be omitted.

Figure 4A:
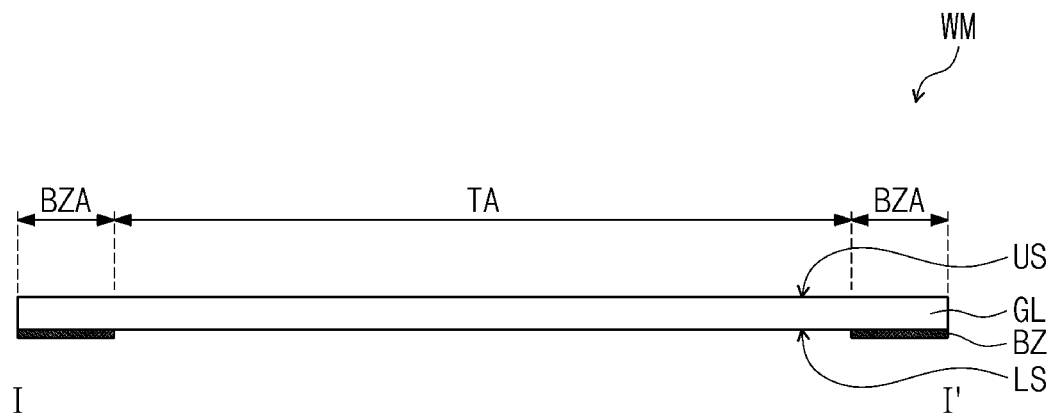
FIGS. 4A and 4B are cross-sectional views of a window according to some embodiments of the inventive concept.
Figure 4A:
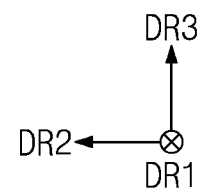
Figure 4B:
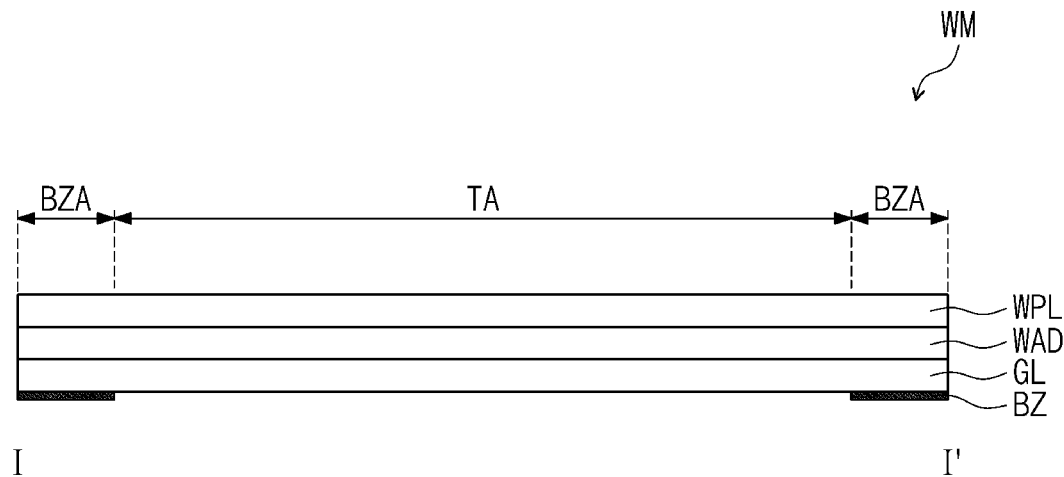
Figure 4B:
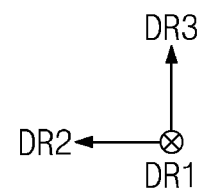

FIGS. 4A and 4B are cross-sectional views of the window WM according to some embodiments of the inventive concept. FIGS. 4A and 4B may be cross-sectional views taken along the line I-I' of the window WM of the display device DD, according to some embodiments of the inventive concept, in FIG. 3.

Referring to FIGS. 4A and 4B, the window WM may include a glass substrate GL. Details of the glass substrate GL according to some embodiments of the inventive concept will be described later.

The glass substrate GL according to some embodiments may include an upper surface US and a lower surface LS. The upper surface US and the lower surface LS of the glass substrate GL may be opposite to each other in the third direction DR3, and a normal direction of each of the upper surface US and the lower surface LS may be parallel to the third direction DR3. The upper surface US of the glass substrate GL may be exposed to the outside of the display device DD.

The window WM may further include a printing layer BZ located on the lower surface LS of the glass substrate GL. The printing layer BZ may be formed on the lower surface LS of the glass substrate GL through printing or deposition, and the printing layer BZ may be directly located on the lower surface LS of the glass substrate GL.

The printing layer BZ may be located on at least a portion of the lower surface LS of the glass substrate GL, and define the bezel region BZA. The printing layer BZ may be a part corresponding to the peripheral region NAA of the display module DM (see FIG. 3).

The printing layer BZ may have a relatively lower light transmittance than the glass substrate GL. For example, the printing layer BZ may have a color (e.g., a set or predetermined color). Accordingly, the printing layer BZ may transmit or reflect only light of a specific color. Alternatively, the printing layer BZ may be a light blocking layer that absorbs incident light. The light transmittance and color of the printing layer BZ may vary according to types and shapes of the display device DD.

Referring to FIG. 4B, the window WM according to some embodiments may further include a window protective layer WPL located above the glass substrate GL. The window protective layer WPL may be located above the upper surface of the glass substrate GL, and serve as an uppermost surface of display devices DD, DD-a (FIGS. 1A and 2A). The window protective layer WPL may be a layer exposed to the outermost surfaces of the display devices DD and DD-a, and function to protect the glass substrate GL and the display module DM, etc.

The window protective layer WPL may have a thickness of about 30 μm to about 100 μm. When the window protective layer WPL has a thickness in the above-mentioned range, the window protective layer WPL may not only have durability, but also maintain flexibility which enables folding and the like. The window protective layer WPL may have a single-layer structure or a multilayer structure. For example, the window protective layer WPL may be a single-layer structure as illustrated in FIG. 4B, or be a two-layer structure in which two layers are stacked.

The window WM according to some embodiments may further include a window adhesive layer WAD located between the glass substrate GL and the window protective layer WPL. The window adhesive layer WAD may bond the glass substrate and the window protective layer WPL. The window adhesive layer WAD may be an optically clear adhesive film (OCA) or an optically clear adhesive resin layer (OCR).

Alternatively, the window WM according to some embodiments may further include a window functional layer including at least one of a hard coating layer or an anti-fingerprint layer. Each of the window functional layers may be a hard coating layer, an anti-fingerprint layer, or a layer that functions as both a hard coating layer and an anti-fingerprint layer at the same time. The hard coating layer may be a layer which imparts a physical strength to the window WM. The anti-fingerprint layer may be a layer which prevents external contamination such as fingerprints, and suppresses wear caused by external friction. In addition, the window functional layer may further include an anti-reflection or anti-glare function.

The glass substrate GL according to some embodiments of the inventive concept may be an ultra-thin glass having a thickness of about 100 μm or less. For example, the glass substrate GL may have a thickness of about 20 μm to about 100 μm. Because the glass substrate has a thickness in the above-mentioned range, the glass substrate may have an appropriate hardness, to be used in a flexible display device, as well as bendable or foldable.

Compared to thick glass substrates, the glass substrate GL having an ultra-small thickness is advantageous in terms of absorption of external impact when having relatively low hardness and/or low brittleness characteristics. That is, when the glass substrate GL does not require high hardness but has appropriate levels of hardness and brittleness, the glass substrate GL may have excellent impact resistance.

Accordingly, the glass substrate GL according to the inventive concept may not contain $Al_2O_3$, which is a component for increasing the mechanical strength of the glass substrate GL, but appropriately contain $Na_2O$ and CaO, when the glass substrate is an ultra-thin glass, and thus exhibit excellent impact resistance.

The glass substrate GL according to some embodiments may contain $SiO_2$, $Na_2O$, and CaO. $SiO_2$ may be a main component for forming glass and serve as a network former. $Na_2O$, which is an alkali oxide, and CaO, which is an alkaline earth metal oxide, may serve as network modifiers.

Because the glass substrate GL includes $SiO_2$, a coefficient of thermal expansion of the glass substrate GL may be decreased and a mechanical strength of the glass substrate GL may be increased.

Because the glass substrate GL includes $Na_2O$, the glass transition temperature of the glass substrate GL may be lowered, thereby reducing the viscosity of the glass substrate GL. Particularly, the glass substrate GL, including NaO with CaO which will be described later, may have excellent impact resistance property, compared to a glass substrate including $Li_2O$ or $K_2O$.

Because the glass substrate GL includes CaO, flexibility may be imparted to the glass substrate GL. Compared to a glass substrate including MgO, the glass substrate GL including CaO is advantageous in terms of impact resistance due to having an appropriate ion size and binding force of calcium ions.

Accordingly, when the glass substrate GL is an ultra-thin substrate, the glass substrate GL including SiO2, Na2O, and CaO may have excellent impact resistance.

The glass substrate GL according to some embodiments may contain, on the basis of the entire glass substrate, more than about 75 mol % and less than about 85 mol % of $SiO_2$, more than about 10 mol % and less than about 20 mol % of $Na_2O$, and more than about 0 mol % and less than about 10 mol % of CaO. For example, the glass substrate GL may contain, on the basis of the entire glass substrate, more than about 78 mol % and less than about 82 mol % of $SiO_2$, more than about 13 mol % and less than about 17 mol % of $Na_2O$, and more than about 3 mol % and less than about 7 mol % of CaO.

Because the glass substrate GL contains $SiO_2$, $Na_2O$, and CaO in the above-mentioned range, the glass substrate GL may have appropriate hardness and brittleness properties. Accordingly, the glass substrate GL may have excellent impact resistance property.

The glass substrate GL according to some embodiments may have a hardness (Vickers hardness) of greater than about 4.5 GPa and less than about 5.0 GPa. For example, the glass substrate GL may have a hardness of greater that about 4.7 GPa and less than about 4.9 GPa or less.

The glass substrate GL according to some embodiments may have a brittleness of greater than about 4.8 $\mu m^{-0.5}$ and less than about 5.8 $\mu m^{-0.5}$. For example, the glass substrate GL may have a brittleness of greater than about 5.0 $\mu m^{-0.5}$ and less than about 5.6 $\mu m^{-0.5}$ or a brittleness of greater than about 5.2 $\mu m^{-0.5}$ and less than about 5.4 $\mu m^{-0.5}$.

The glass substrate GL according to some embodiments may have a Young's modulus of greater than about 60 GPa and less than about 70 GPa. For example, the glass substrate GL may have a Young's modulus of greater than about 64 GPa and less than about 68 GPa.

The glass substrate GL according to some embodiments may have a coefficient of thermal expansion of greater than about 85×10⁻⁷/K and less than about 95×10⁻⁷/K. For example, the glass substrate GL may have a coefficient of thermal expansion of greater than about 87×10⁻⁷/K and less than about 93×10⁻⁷/K.

The glass substrate GL according to some embodiments may have a fracture toughness of greater than about 0.7 MPa·m$^{-0.5}$ and less than about 1.2 MPa·m$^{0.5}$. For example, the glass substrate GL may have a fracture toughness of greater than about 0.8 MPa·m$^{0.5}$ and less than about 1.0 MPa·m$^{0.5}$.

The glass substrate GL according to some embodiments may have a glass transition temperature of greater than about 500° C. and less than about 600° C. For example, the glass substrate GL may have a glass transition temperature of greater than about 530° C. and less than about 570° C.

The glass substrate GL according to some embodiments may have a Poisson's ratio of greater than about 0.18 and less than about 0.22. For example, the glass substrate GL may have a Poisson's ratio of greater than about 0.19 and less than about 0.21.

The glass substrate GL according to some embodiments may have a density of greater than about 2.3 g/cm³ and less than about 2.6 g/cm³. For example, the glass substrate GL may have a density of greater than about 2.4 g/cm³ and less than about 2.5 g/cm³.

The glass substrate GL according to some embodiments contains $SiO_2$, an alkali oxide, and an alkaline earth metal oxide, and satisfies the following Equation (1).

$$R \text{ ratio} = 0 \quad (\text{Eq. 1})$$

where R ratio is a ratio of moles of $Al_2O_3$ to moles of the alkali oxide. That is, this may mean that the glass substrate GL does not contain $Al_2O_3$. When the glass substrate GL contains $Al_2O_3$, mechanical strength may be increased. However, when the glass substrate GL is an ultra-thin glass substrate, it may be advantageous not to contain $Al_2O_3$ in terms of absorption of external impact.

According to some embodiments, on the basis of the entire glass substrate GL, the alkali oxide may be contained in an amount of more than about 13 mol % and less than about 18 mol %. For example, more than about 14 mol % and less than about 16 mol % the alkali oxide may be contained on the basis of the entire glass substrate GL.

According to some embodiments, on the basis of the entire glass substrate GL, the alkaline earth metal oxide may be contained in an amount of more than about 0 mol % and less than about 10 mol %. For example, more than about 3 mol % and less than about 7 mol % of the alkaline earth metal oxide may be contained on the basis of the entire glass substrate GL.

Table 1 shows compositions of glass substrates according to Example 1 and Comparative Example 1. A content of each component listed in Table 1 is expressed in mol %.

TABLE 1

| | $SiO_2$ | $Al_2O_3$ | MgO | CaO | $Na_2O$ | $K_2O$ |
|---|---|---|---|---|---|---|
| Example 1 | 80.0 | 0 | 0 | 5.0 | 15.0 | 0 |
| Comparative Example 1 | 70.0 | 7.7 | 7.5 | 0 | 12.7 | 1.7 |

Referring to Table 1, compared to the glass substrate according to Comparative Example 1, the glass substrate according to Example 1 does not contain $Al_2O_3$, MgO, and $K_2O$, and contains CaO. In addition, the glass substrate according to Example 1 contains more $SiO_2$ and $Na_2O$ than the glass substrate according to Comparative Example 1.

Table 2 shows the content of alkali oxide ($R_2O$), the content of alkali earth metal oxide (RO), and R ratio, for the glass substrates according to Example 1 and Comparative Example 1 in Table 1. R ratio is a ratio of moles of $Al_2O_3$ to moles of the alkali oxides. The content of each component listed in Table 2 is expressed in mol %.

TABLE 2

| | $R_2O$ (Alkali oxide) | RO (Alkaline earth metal oxide) | R ratio ($Al_2O_3/R_2O$) |
|---|---|---|---|
| Example 1 | 15.0 | 5 | 0 |
| Comparative Example 1 | 14.4 | 7.5 | 0.53 |

Referring to Table 2, compared to the glass substrate according to Comparative Example 1, the glass substrate according to the Example 1 does not contain $Al_2O_3$, and thus R ratio is 0.

Table 3 shows physical properties of the glass substrates according to Example 1 and Comparative Example 1 in Tables 1 and 2. Evaluation was performed while the thickness of each of the glass substrates according to Example 1 and Comparative Example 1 in Table 3 was about 50 μm.

TABLE 3

| | Hardness (GPa) | Brittleness (μm$^{-0.5}$) | Young's Modulus (GPa) | Coefficient of thermal expansion (×10⁻⁷/K) | Fracture toughness (MPa · m$^{0.5}$) | Glass transition temperature (° C.) | Poisson's ratio | Density (g/cm³) |
|---|---|---|---|---|---|---|---|---|
| Example 1 | 4.79 | 5.34 | 66 | 91.2 | 0.90 | 549 | 0.197 | 2.434 |
| Comparative Example 1 | 5.70 | 6.55 | 76 | 89.0 | 0.87 | 635 | 0.220 | 2.461 |

Referring to Table 3, the glass substrate according to Example 1 has a lower hardness and a lower brittleness than the glass substrate according to Comparative Example 1. Also, it is seen that the glass substrate according to Example 1 has a lower Young's modulus, a lower glass transition temperature, a lower Poisson's ratio, and a lower density, and has a higher coefficient of thermal expansion and a higher fracture toughness than the glass substrate according to Comparative Example 1.

It is considered that because the glass substrate according to the Example 1 does not contain $Al_2O_3$ and contains CaO and $Na_2O$ in certain percentages, the glass substrate according to the Example 1 has lower hardness and brittleness characteristics.

Table 4 shows a result of a pen-drop test to evaluate impact resistance of the glass substrates according to Example 1 and Comparative Example 1 in Tables 1 through 3. In a pen-drop test, a drop height at which cracks occur on the glass substrate was measured using a pen having a ballpoint with a diameter of about 0.7 (p and a weight of about 1.13 grams, while changing a drop height.

TABLE 4

| | Pen-drop limit height (cm) |
|---|---|
| Example 1 | 3.15 |
| Comparative Example 1 | 2.43 |

Referring to Table 4, it may be confirmed that the pen-drop limit height for the glass substrate according to Example 1, that is, the drop height at which cracks occur, is increased by about 30% than a pen-drop limit height for the glass substrate according to Comparative Example 1.

Referring to Tables 3 and 4 together, it may be considered that the glass substrate according to Example 1 has a lower hardness than the glass substrate according to Comparative Example 1, accordingly has a lower brittleness, and thus absorbs external impact well. That is, the glass substrate according to Example 1 has more excellent impact resistance than the glass substrate according to Comparative Example 1.

Figure 5:
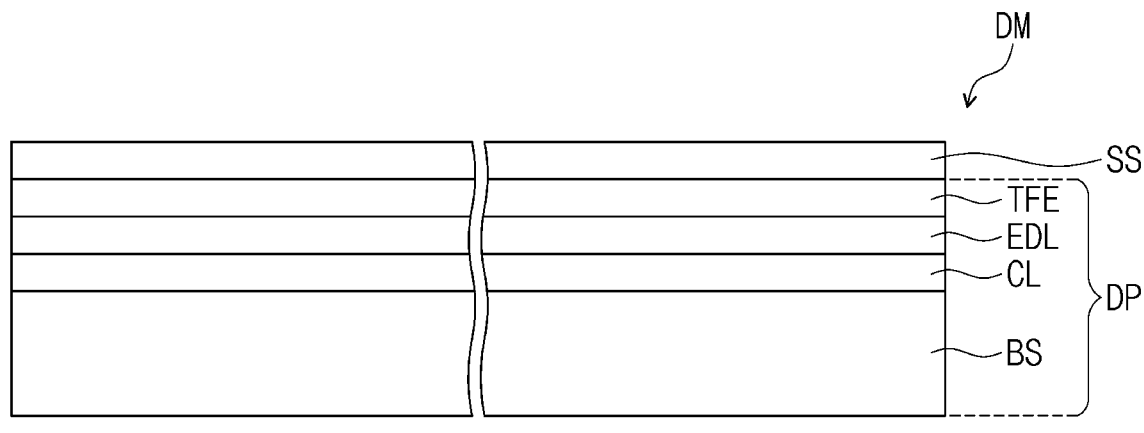
FIG. 5 is a cross-sectional view of a display module according to some embodiments of the inventive concept.

FIG. 5 is a cross-sectional view of a display module DM according to some embodiments of the inventive concept. The display module DM may include a display panel DP and a sensor layer SS located on the display panel DP.

The display panel DP may include a base layer BS, a circuit layer CL, a light-emitting element layer EDL and an encapsulation layer TFE.

The base layer BS may be a member providing a base surface on which the circuit layer CL is located. The base layer BS may be a rigid substrate, or a flexible substrate capable of bending, folding, rolling, etc. The base layer BS may be a glass substrate, a metal substrate, a polymer substrate, etc. However, embodiments of the inventive concept are not limited thereto, the base layer BS may be an inorganic layer, an organic layer, or a composite material layer.

The circuit layer CL may be located on the base layer BS. The circuit layer CL may include an insulating layer, a semiconductor pattern, a conductive pattern, a signal line, etc. The insulating layer, the semiconductor layer, and the conductive layer may be formed on the base layer BS through coating, depositing, etc., and the insulating layer, the semiconductor layer, and the conductive layer may be selectively patterned by performing a photolithography process and an etching process multiple times. Thereafter, a semiconductor pattern, a conductive pattern, and a signal line, which are included in the circuit layer CL, may be formed.

The light-emitting element layer EDL may be located on the circuit layer CL. The light-emitting element layer EDL may include a light-emitting element. For example, the light-emitting element may include an organic light-emitting element, an inorganic light-emitting element, an organic-inorganic light-emitting element, a quantum dot, a quantum rod, a micro LED or a nano LED.

The encapsulation layer TFE may be located on the light-emitting element layer EDL. The encapsulation layer TFE may cover the light-emitting element layer EDL. The encapsulation layer TFE may protect the light-emitting element layer EDL from foreign matter such as moisture, oxygen, and dust particles.

The sensor layer SS may be located on the display panel DP. The sensor layer SS may detect an external input applied from the outside. The external input may be a user's input. The user's input may include various types of external inputs such as a touch by the user's body part, light, heat, pen, pressure, or the like.

The sensor layer SS may be formed on the display panel DP through a continuous process. In this case, the sensor layer SS may be directly located on the display panel DP. Herein, the wording, "directly located" may mean that the third component is not located between the sensor layer SS and the display panel DP. That is, an additional adhesive member may not be located between the sensor layer SS and the display panel DP. For example, the sensor layer SS may be directly located on the encapsulation layer TFE in the display panel DP. The sensor layer SS and the display panel DP may be bonded to each other using the adhesive member. The adhesive member may include a typical adhesive agent or bonding agent.

An optical layer may further be located on the sensor layer SS. The optical layer may be directly located on the sensor layer SS. The optical layer may be formed on the sensor layer SS through a continuous process. The optical layer may reduce the reflectance for external light incident from the outside of the display module DM. The optical layer may include a polarization layer or a color filter layer.

According to some embodiments, the sensor layer SS may be omitted, and the optical layer may be directly located on the display panel DP. According to some embodiments, positions of the sensor layer SS and the optical layer may be interchanged.

A window according to some embodiments of the inventive concept includes an ultra-thin glass substrate containing $SiO_2$, $Na_2O$ and CaO, and thus has low hardness and low brittleness characteristics. Accordingly, the window according to some embodiments of the inventive concept may exhibit an excellent impact-resistant property.

Since a display device according to some embodiments of the inventive concept includes an ultra-thin glass substrate having an excellent impact-resistant property in a window, and thus may exhibit an excellent impact-resistant property.

According to the foregoing, a window according to some embodiments of the inventive concept including an ultra-thin glass substrate containing $SiO_2$, $Na_2O$, and CaO, and thus the window having excellent impact resistance and a display device including the same may be provided.

Although the embodiments of the inventive concept have been described, it is understood that the inventive concept should not be limited to these embodiments but various changes and modifications can be made by one ordinary skilled in the art within the spirit and scope of the inventive concept as hereinafter claimed.

Therefore, the technical scope of embodiments according to the inventive concept are not limited to the contents described in the detailed description of the specification, but rather are defined by the appended claims, and their equivalents.

What is claimed is:
1. A window comprising:
   a glass substrate having a thickness in a range of 20 micrometers (μm) to 100 μm,
   wherein the glass substrate contains, on a basis of an entirety of the glass substrate, more than 75 mol % and less than 85 mol % of $SiO_2$, more than 10 mol % and less than 20 mol % of $Na_2O$, and more than 3 mol % and less than 10 mol % of CaO.

2. The window of claim 1, wherein the glass substrate has a hardness of greater than 4.5 GPa and less than 5.0 GPa.

3. The window of claim 1, wherein the glass substrate has a brittleness of greater than 4.8 $\mu m^{-0.5}$ and less than 5.8 $\mu m^{-0.5}$.

4. The window of claim 1, wherein the glass substrate has a Young's modulus of greater than 60 GPa and less than 70 GPa.

5. The window of claim 1, wherein the glass substrate has a coefficient of thermal expansion of greater than $85 \times 10^{-7}$/K and less than $95 \times 10^{-7}$/K.

6. The window of claim 1, wherein the glass substrate has a fracture toughness of greater than 0.7 MPa·m$^{0.5}$ and less than 1.2 MPa·m$^{0.5}$.

7. The window of claim 1, wherein the glass substrate has a glass transition temperature of greater than 500° C. and less than 600° C.

8. The window of claim 1, wherein the glass substrate has a Poisson's ratio of greater than 0.18 and less than 0.22.

9. The window of claim 1, wherein the glass substrate has a density of greater than 2.3 g/cm$^3$ and less than 2.6 g/cm$^3$.

10. A window comprising:
a glass substrate having a thickness of 20 micrometers ($\mu$m) to 100 $\mu$m,
wherein the glass substrate contains, on a basis of an entirety of the glass substrate, 78 mol % or more and less than 85 mol % of SiO$_2$, an alkali oxide, and an alkaline earth metal oxide, and has a ratio of moles of Al$_2$O$_3$ to moles of the alkali oxide that is equal to zero.

11. The window of claim 10, wherein the glass substrate contains more than 13 mol % and less than 18 mol % of the alkali oxide on a basis of an entirety of the glass substrate.

12. The window of claim 10, wherein the glass substrate contains more than 0 mol % and less than 10 mol % of the alkaline earth metal oxide on a basis of an entirety of the glass substrate.

13. The window of claim 10, wherein the alkali oxide is Na$_2$O.

14. The window of claim 13, wherein the glass substrate contains more than 10 mol % and less than 20 mol % of the Na$_2$O, on a basis of an entirety of the glass substrate.

15. The window of claim 10, wherein the alkaline earth metal oxide is CaO.

16. The window of claim 15, wherein the glass substrate contains more than 0 mol % and less than 10 mol % of the CaO, on a basis of an entirety of the glass substrate.

17. The window of claim 10, wherein the glass substrate has a hardness of greater than 4.5 GPa and less than 5.0 GPa, and has a brittleness of greater than 4.8 $\mu m^{-0.5}$ and less than 5.8 $\mu m^{-0.5}$.

18. A display device comprising:
a display panel; and
a window on the display panel,
wherein the window includes a glass substrate having a thickness of 20 micrometers ($\mu$m) to 100 $\mu$m, and
the glass substrate contains, on a basis of an entirety of the glass substrate, more than 75 mol % and less than 85 mol % of SiO$_2$, more than 10 mol % and less than 20 mol % of Na$_2$O, and more than 3 mol % and less than 10 mol % of CaO, respectively.

19. The display device of claim 18, wherein the glass substrate has a hardness of greater than 4.5 GPa and less than 5.0 GPa, and has a brittleness of greater than 4.8 $\mu m^{-0.5}$ and less than 5.8 $\mu m^{-0.5}$.

20. The display device of claim 18, further comprising an adhesive layer between the display panel and the window.

* * * * *